(12) United States Patent
Oike

(10) Patent No.: US 11,778,820 B2
(45) Date of Patent: Oct. 3, 2023

(54) SEMICONDUCTOR STORAGE DEVICE AND MANUFACTURING METHOD FOR SEMICONDUCTOR DEVICE

(71) Applicant: Kioxia Corporation, Minato-ku (JP)

(72) Inventor: Go Oike, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 344 days.

(21) Appl. No.: 17/009,005

(22) Filed: Sep. 1, 2020

(65) Prior Publication Data
US 2021/0265387 A1     Aug. 26, 2021

(30) Foreign Application Priority Data
Feb. 25, 2020   (JP) ................. 2020-029725

(51) Int. Cl.
*H10B 43/27*     (2023.01)
*H10B 43/10*     (2023.01)

(52) U.S. Cl.
CPC ............. *H10B 43/27* (2023.02); *H10B 43/10* (2023.02)

(58) Field of Classification Search
CPC .................... H01L 27/11582; H10B 43/27
See application file for complete search history.

(56) References Cited

U.S. PATENT DOCUMENTS

| 10,276,237 B2 | 4/2019 | Lee et al. |
| 2017/0213846 A1* | 7/2017 | Lee ............. H01L 29/7827 |
| 2017/0345494 A1* | 11/2017 | Lee ............. H01L 27/2454 |
| 2019/0296040 A1 | 9/2019 | Fujii et al. |

FOREIGN PATENT DOCUMENTS

TW          201941410 A       10/2019

* cited by examiner

*Primary Examiner* — Robert G Bachner
*Assistant Examiner* — Molly K Reida
(74) *Attorney, Agent, or Firm* — Oblon, McClelland, Maier & Neustadt, L.L.P.

(57) ABSTRACT

A semiconductor storage device according to an embodiment includes a stacked body in which a conductive layer and an insulating layer are stacked alternately in a first direction, a plurality of columnar bodies that extend in the first direction inside the stacked body and each include a semiconductor body, a plurality of charge storage films that are disposed between at least one of a plurality of the conductive layers and each of a plurality of the semiconductor bodies, a plurality of bit lines that extend above the stacked body in a second direction intersecting the first direction, an interlayer insulating layer that is between the stacked body and the bit lines, and contacts each of which penetrates the interlayer insulating layer and is electrically connected to one of the plurality of bit lines, in which the contacts have a first contact that is connected to one of the columnar bodies and a second contact that is connected to a plurality of the columnar bodies.

10 Claims, 13 Drawing Sheets

SEMICONDUCTOR STORAGE DEVICE AND MANUFACTURING METHOD FOR SEMICONDUCTOR DEVICE

CROSS-REFERENCE TO RELATED APPLICATION

This application is based upon and claims the benefit of priority from Japanese Patent Application No. 2020-029725, Feb. 25, 2020; the entire contents of which are incorporated herein by reference.

FIELD

An embodiment of the present invention relates to a semiconductor storage device and a manufacturing method for semiconductor device.

BACKGROUND

NAND-type flash memories in which memory cells are stacked in three dimensions are known.

DETAILED DESCRIPTION

Figure 1:
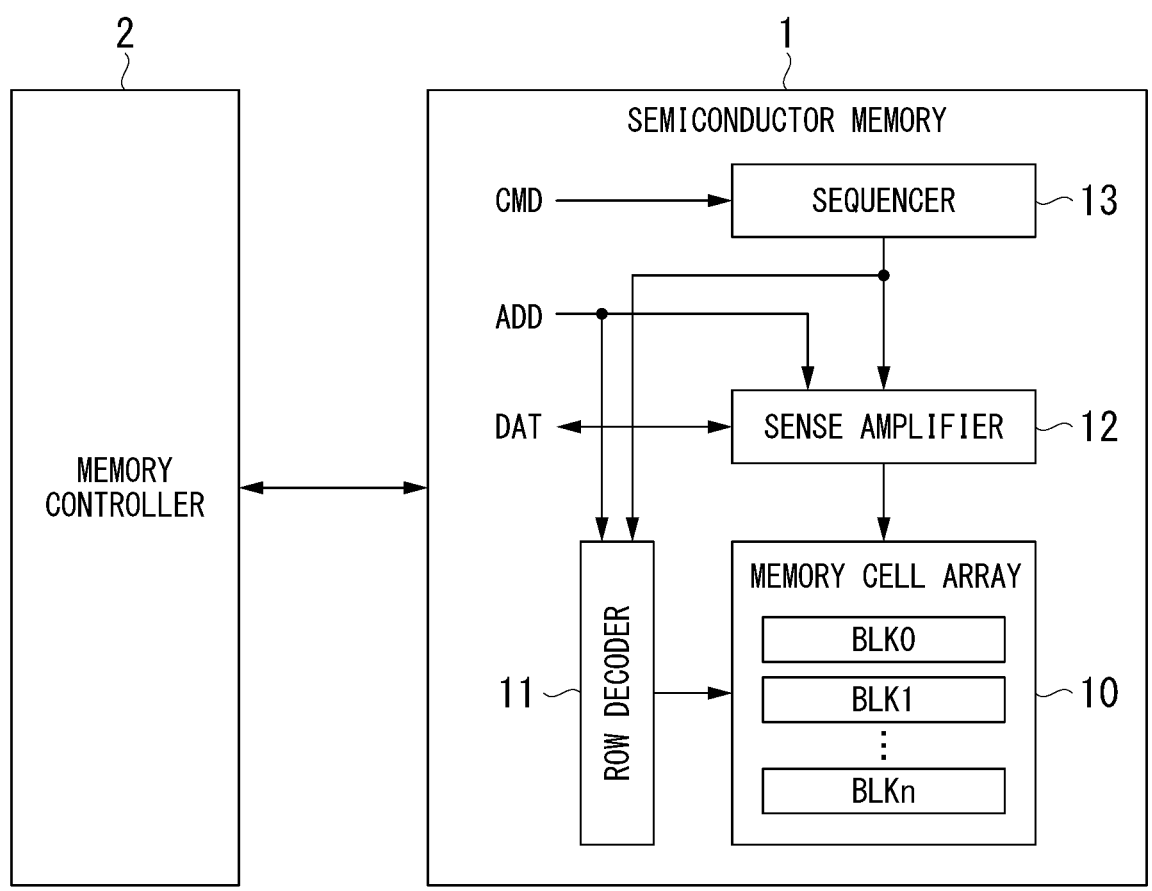
FIG. 1 is a block diagram illustrating a circuit configuration of a semiconductor storage device according to a first embodiment.

A semiconductor storage device according to an embodiment includes a stacked body, a plurality of columnar bodies, a plurality of charge storage films, a plurality of bit lines, a plurality of interlayer insulating layers, and a plurality of contacts. The stacked body has conductive layers and insulating layers that are stacked alternately in a first direction. Each of the plurality of columnar bodies extends in the first direction inside the stacked body. Each of the plurality of columnar bodies has a semiconductor body. Each of the plurality of charge storage films is disposed between at least one of a plurality of the conductive layers and one of the plurality of semiconductor bodies. Each of the plurality of bit lines extends above the stacked body in a second direction intersecting the first direction. The interlayer insulating layer is between the stacked body and the plurality of bit lines. Each of the plurality of contacts penetrates the interlayer insulating layer and is electrically connected to any of the plurality of bit lines. The plurality of contacts have a first contact that is connected to one of the semiconductor bodies and a second contact that is connected to two of the plurality of semiconductor bodies.

A semiconductor storage device according to an embodiment will be described below with reference to the drawings. In the following description, the same reference numerals will be given to constituent components having the same or equivalent functions. In addition, overlapping description of the constituent components may be omitted. The drawings are schematic or conceptual, and the relationship between thicknesses and widths of each part, the ratios of sizes between parts, and the like are not necessarily the same as the real ones. "Connection" in the present specification is not limited to being physically connected and includes being electrically connected. "Extending in an A direction" in the specification means that, for example, among dimensions in an X direction, a Y direction, and a Z direction which will be described below, a dimension in the A direction is greater than the smallest dimension. "A direction" may be any direction.

First, the X direction, the Y direction, and the Z direction will be defined. The X direction and the Y direction are directions that are substantially parallel to a surface of a substrate Sub which will be described. The X direction is a direction in which a slit, which will be described below, extends. The Y direction is a direction intersecting (e.g., substantially orthogonal to) the X direction. The Z direction is a direction intersecting (e.g., substantially orthogonal to) the X direction and the Y direction and away from the substrate Sub. These expressions, however, are for the sake of convenience, and do not define the direction of gravity. In the present embodiment, the Z direction is an example of a "first direction," the Y direction is an example of a "second direction," and the X direction is an example of a "third direction."

First Embodiment

FIG. 1 is a block diagram illustrating a system configuration of a semiconductor memory 1. The semiconductor memory 1 is a non-volatile semiconductor storage device and, for example, may be a NAND-type flash memory. The semiconductor memory 1 includes, for example, a memory cell array 10, a row decoder 11, a sense amplifier 12, and a sequencer 13.

The memory cell array 10 includes a plurality of blocks BLK0 to BLKn (n is an integer greater than or equal to 1). A block BLK is a set of non-volatile memory cell transistors MT (see FIG. 2). A plurality of bit lines and a plurality of word lines are provided in the memory cell array 10. Each memory cell transistor MT is connected to one bit line and one word line. Details of the configuration of the memory cell array 10 will be described below.

The row decoder 11 selects one block BLK based on address information ADD received from an external memory controller 2. The row decoder 11 applies a desired voltage to each of the plurality of word lines to control write operations and read operations of data with respect to the memory cell array 10.

The sense amplifier 12 applies a desired voltage to each bit line according to write data DAT received from the memory controller 2. The sense amplifier 12 determines data stored in a memory cell transistor MT based on the voltage of the bit line and transmits the determined read data DAT to the memory controller 2.

The sequencer 13 controls overall operations of the semiconductor memory 1 based on a command CMD received from the memory controller 2.

The semiconductor memory 1 and the memory controller 2 described above may be combined to configure one semiconductor device. Examples of such a semiconductor device include, for example, memory cards such as SD (registered trademark) cards, solid state drives (SSDs), and the like.

Next, an electrical configuration of the memory cell array 10 will be described.

Figure 2:
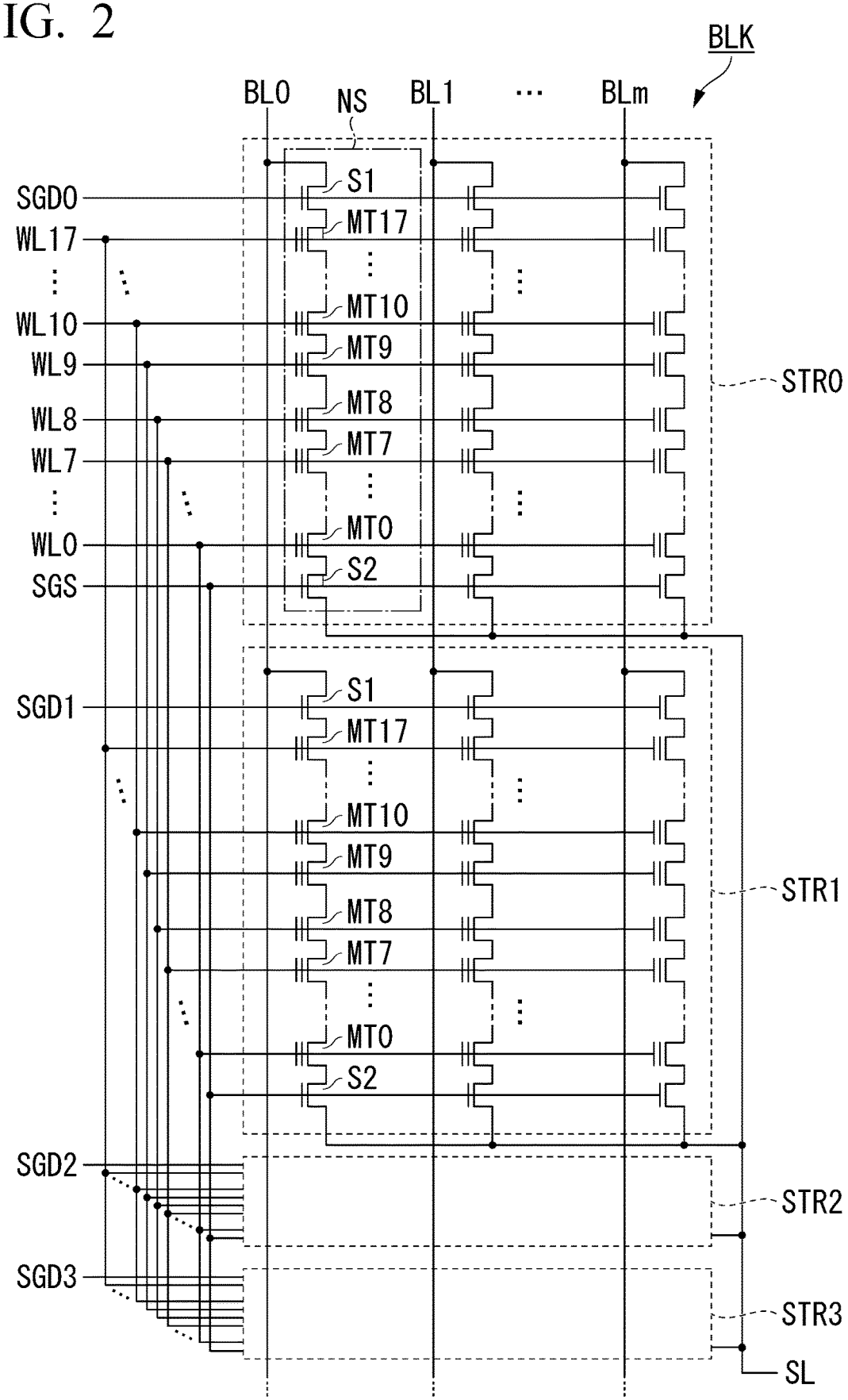
FIG. 2 is a circuit diagram of a memory cell array of the semiconductor storage device according to the first embodiment.

FIG. 2 is a diagram illustrating an equivalent circuit of the memory cell array 10 with one block BLK extracted. The block BLK includes a plurality of (e.g., 4) strings STR0 to STR3.

The strings STR0 to STR3 are a set of a plurality of NAND strings NS. One end of each NAND string NS is connected to any of bit lines BL0 to BLm (m is an integer greater than or equal to 1). The other end of each NAND string NS is connected to a source line SL. Each NAND string NS includes a plurality of (e.g., 18) memory cell transistors MT0 to MT17, a first selection transistor S1, and a second selection transistor S2.

The plurality of memory cell transistors MT0 to MT17 are electrically connected to each other in series. The memory cell transistors MT each include a control gate and a charge storage film and store data in a non-volatile manner. The memory cell transistors MT store electric charge in the charge storage film according to a voltage applied to the control gate. The control gate of each memory cell transistor MT is connected to any of corresponding word lines WL0 to WL17. The memory cell transistor MT is electrically connected to the row decoder 11 via the word line WL.

The first selection transistor S1 of each NAND string NS is connected between the plurality of memory cell transistors MT0 to MT17 and any of the bit lines BL0 to BLm. A drain of the first selection transistor S1 is connected to any of the bit lines BL0 to BLm. A source of the first selection transistor S1 is connected to the memory cell transistor MT17. The control gate of the first selection transistor S1 of each NAND string NS is connected to any of selection gate lines SGD0 to SGD3. The first selection transistor S1 is electrically connected to the row decoder 11 via a selection gate line SGD. The first selection transistor S1 connects the NAND string NS to the bit line BL when a predetermined voltage is applied to any of the selection gate lines SGD0 to SGD3.

The second selection transistor S2 of each NAND string NS is connected between the plurality of memory cell transistors MT0 to MT17 and the source line SL. A drain of the second selection transistor S2 is connected to the memory cell transistor MT0. A source of the second selection transistor S2 is connected to the source line SL. The control gate of the second selection transistor S2 is connected to a selection gate line SGS. The second selection transistor S2 is electrically connected to the row decoder 11 via the selection gate line SGS. The second selection transistor S2 connects the NAND string NS and the source line SL when a predetermined voltage is applied to the selection gate line SGS.

Next, a structure of the memory cell array 10 will be described. The memory cell array 10 has a cell array region and a peripheral region. In the cell array region, NAND strings NS are integrated. In the peripheral region, peripheral circuits that control the cell array region are disposed. The peripheral region may be adjacent to the cell array region in the X direction or the Y direction, or may be stacked in the Z direction with respect to the cell array region.

Figure 3:
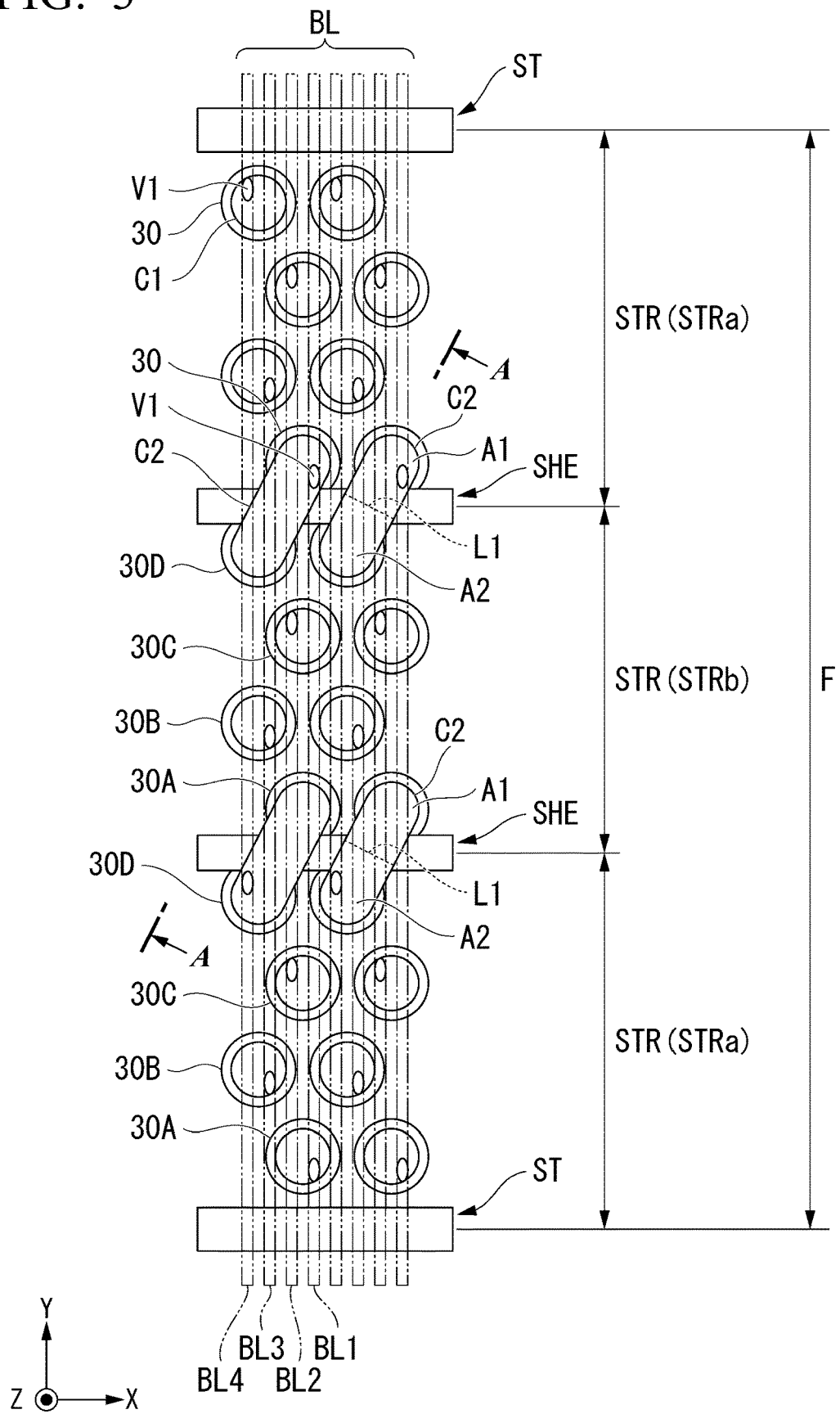
FIG. 3 is a plan view of a cell array region according to the first embodiment.
Figure 4:
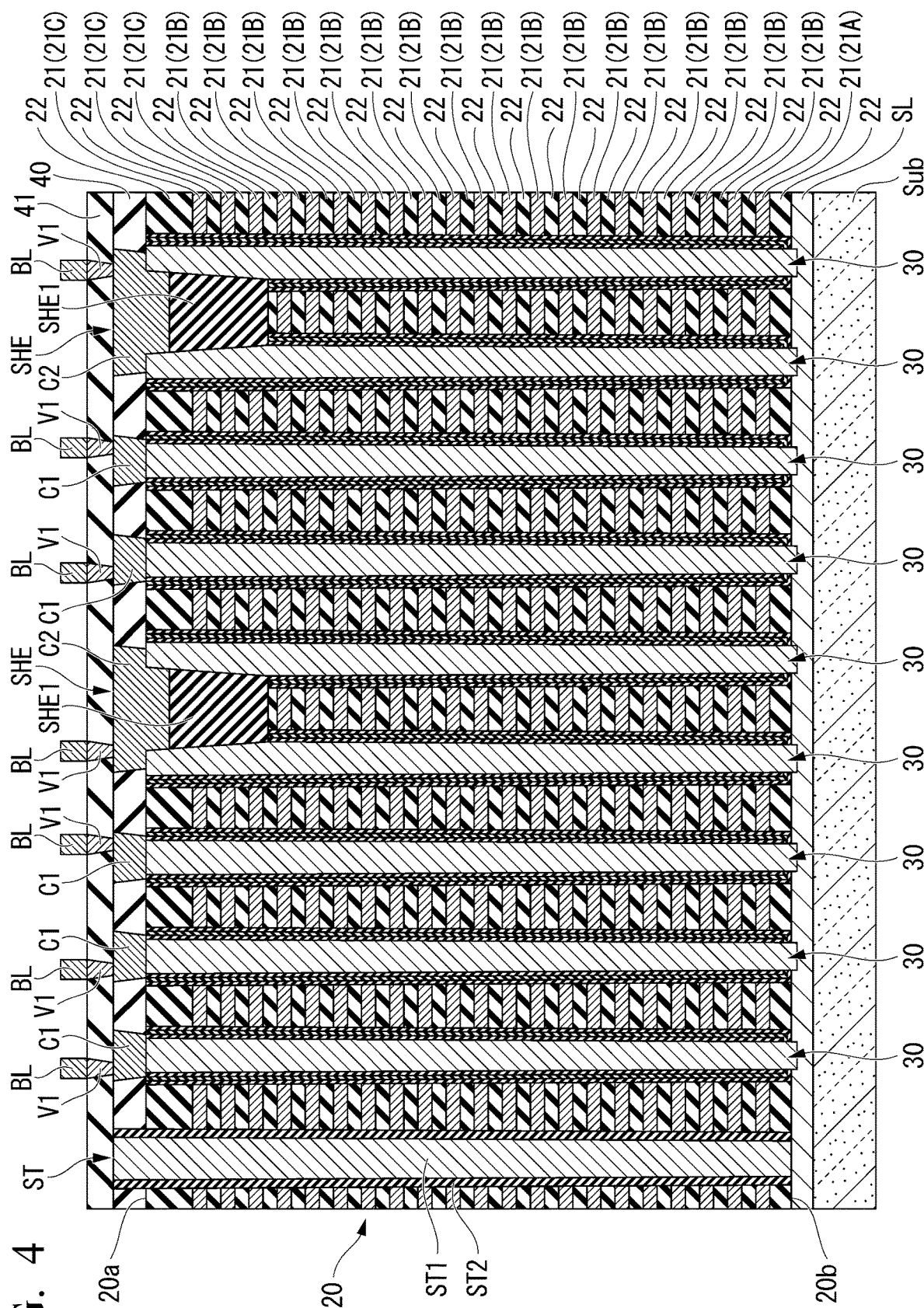
FIG. 4 is a cross-sectional view of the cell array region according to the first embodiment.

FIG. 3 is a plan view of characteristic parts of the cell array region of the memory cell array 10. FIG. 4 is a cross-sectional view of the cell array region of the memory cell array 10. FIG. 3 is a diagram of a surface of a stacked body 20 in a plan view showing bit lines 11 positioned above the stacked body 20 in the Z direction using dotted lines. FIG. 4 is a cross-sectional view of the cell array region cut along the line A-A of FIG. 3.

The cell array region has the substrate Sub, the source line SL, the stacked body 20, a plurality of columnar bodies 30, interlayer insulating layers 40 and 41, first contacts C1, second contacts C2, vias V1, and a plurality of bit lines BL.

The substrate Sub is, for example, a silicon substrate. The cell array region and the peripheral region of the memory cell array 10 are formed on, for example, the substrate Sub. The source line SL is disposed on the substrate Sub. The source line SL is made of a conductor or a semiconductor. The source line SL is, for example, a p-type semiconductor. The source line SL extends in the X direction and the Y direction.

The stacked body 20 has a plurality of conductive layers 21 and a plurality of insulating layers 22 in the Z direction. The conductive layers 21 and the insulating layers 22 are alternately stacked. The plurality of conductive layers 21 each extend in the X direction and the Y direction. The plurality of insulating layers 22 each extend in the X direction and the Y direction. The conductive layers 21 may be made of, for example, a metal or a semiconductor. The conductive layers 21 may be made of, for example, tungsten, or polysilicon doped with impurities. The number of conductive layers 21 may be freely set.

The conductive layers 21 are divided into, for example, three parts in terms of function. A conductive layer 21A is closest to the source line SL among the plurality of conductive layers 21. The number of conductive layers 21A may be multiple. The conductive layer 21A functions as, for example, the selection gate line SGS connected to the second selection transistor S2. Conductive layers 21B are second closest to the source line SL next after the conductive layer 21A among the plurality of conductive layers 21. The conductive layers 21B are connected to the word lines WL, respectively. The conductive layers 21B function as gate electrodes of the memory cell transistors MT. Conductive layers 21C are layers other than the conductive layers 21A and 21B among the plurality of conductive layers 21. The conductive layers 21C are, for example, several conductive layers from the top of the stacked body 20. The conductive layers 21C function as, for example, the selection gate lines SGD connected to the first selection transistor S1.

The insulating layers 22 are disposed between the conductive layer 21 and the source line SL and between the conductive layers 21 adjacent to each other in the Z direction. The insulating layers 22 contain, for example, silicon oxide. The insulating layers 22 insulate between adjacent conductive layers 21. The number of insulating layers 22 is determined based on the number of conductive layers 21.

The stacked body 20 has a plurality of slits in a plan view taken in the Z direction. The slits partition the stacked body 20 in the Y direction. The slits extend in the X direction. The slits include first slits ST and second slits SHE. The first slits ST are an example of second dividers, and the second slits SHE are an example of first dividers. The first slits ST are deep slits, and the second slits SHE are shallow slits. A region separated by two first slits ST that are adjacent to each other in a plan view taken in the Z direction is called a finger F, and a region separated by a first slit ST and a second slit SHE that are adjacent to each other in a plan view taken in the Z direction or a region divided by two adjacent second slits SHE is called a string STR. Among string STRs, a region separated by a first slit ST and a second slit SHE that are adjacent to each other is called a first string STRa, and a region separated by two adjacent second slits SHE is called a string STRb. Although the number of strings STR included in one finger F may be any number, the number of strings STR may be, for example, an odd number.

The first slits ST extend from a first surface 20a to a second surface 20b of the stacked body 20. The first surface 20a is a surface of the stacked body 20 on the bit line BL side, and the second surface 20b is a surface of the stacked body 20 on the substrate Sub side. The first slits ST, for example, penetrate the stacked body 20. The first slits ST separate all of the plurality of conductive layers 21 in the Y direction. Each first slit ST includes, for example, a conductor ST1 and a coating layer ST2 in order from the inner side. The conductor ST1 is an interconnection connected to the source line SL. The conductor ST1 is made of, for example, tungsten. The coating layer ST2 is an insulator. The coating layer ST2 prevents, for example, short-circuiting between the conductor ST1 and the conductive layers 21A, 21B, and 21C. There are an even number of second slits SHE, for example, between adjacent first slits ST.

The second slits SHE extend from the first surface 20a of the stacked body 20 to a halfway point of the stacked body 20 in the Z direction. The second slits SHE separate some of the plurality of conductive layers 21C in the Y direction. The second slits SHE each include an insulator SHE1 and a second contact C2. The second contact C2 is on the insulator SHE1. The insulator SHE1 electrically divides the conductive layers 21C in the Y direction. The insulator SHE1 contains, for example, silicon oxide.

A plurality of columnar bodies 30 are in the stacked body 20. Each of the columnar bodies 30 extends in the Z direction. Each of the columnar bodies 30, for example, penetrates the stacked body 20 in the Z direction. The plurality of columnar bodies 30 are arranged, for example, in a zigzag in the Y direction in a plan view taken in the Z direction. The numbers of the columnar bodies 30 arranged in the zigzag in the Y direction are, for example, equal in the strings STR. Each of the strings STR illustrated in FIG. 3 has four columnar bodies 30 arranged in a zigzag in the Y direction. The columnar bodies 30 are circular, elliptical or oval, for example, in a plan view taken in the Z direction. Columnar bodies 30 adjacent to a second slit SHE in the Y direction, for example, are in contact with the second slit SHE. The columnar bodies 30 adjacent to the second slit SHE in the Y direction have, for example, a shape obtained by cutting out a part of a circle, an ellipse or an oval in a plan view taken in the Z direction. The columnar bodies 30 may not be in contact with the second slit SHE when a width of the second slit SHE is sufficiently narrow or there is a processing variation of the columnar bodies 30.

Figure 5:
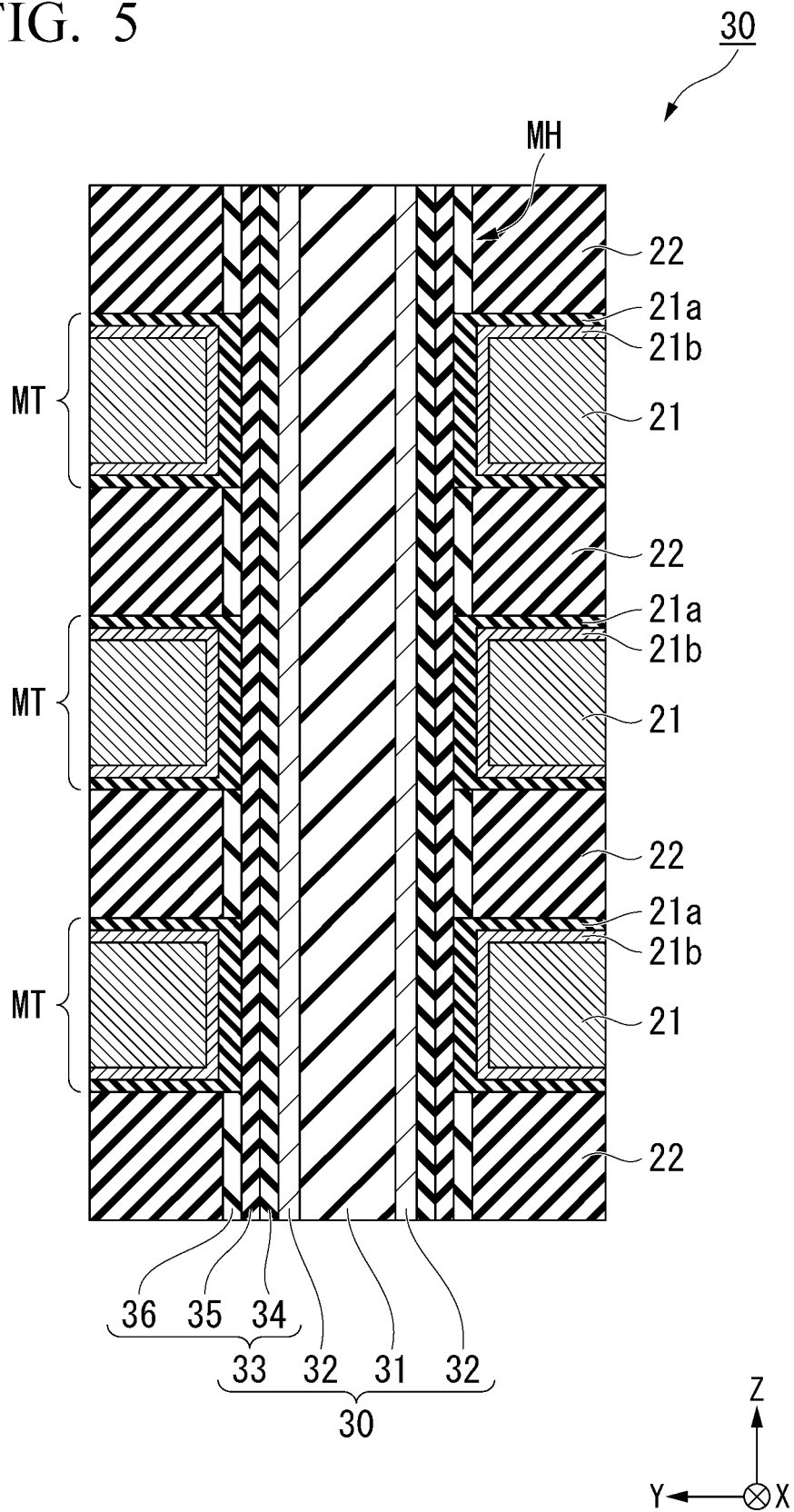
FIG. 5 is an enlarged cross-sectional view of the surroundings of a columnar body according to the first embodiment.
Figure 6:
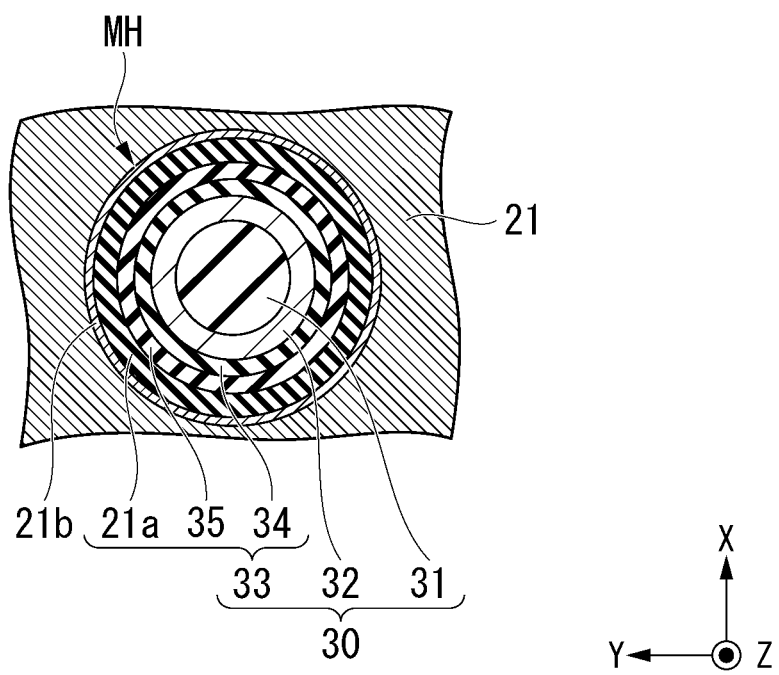
FIG. 6 is a cross-sectional view in which the surroundings of the columnar body are enlarged and cut along a conductive layer according to the first embodiment.

FIG. 5 is an enlarged cross-sectional view of the surroundings of a columnar body 30 according to the first embodiment. FIG. 6 is a cross-sectional view in which the surroundings of the columnar body 30 are cut along a conductive layer 21 according to the first embodiment. FIG. 5 illustrates a cross-section of the columnar body 30 cut in a YZ plane, and FIG. 6 illustrates a cross-section of the columnar body 30 cut in an XY plane. The columnar body 30 is provided in a memory hole MH formed inside the stacked body 20.

Each of the columnar bodies 30 has a core 31, a semiconductor body 32, and a memory film 33. Here, an example in which the memory film 33 is included in the columnar body 30 is presented. However, the core 31 and the semiconductor body 32 may be regarded as the columnar body, and the memory film 33 may be regarded as being outside the columnar body. In a floating gate structure, for example, a charge storage film, which will be described below, is outside a columnar body. The memory hole MH includes the core 31, the semiconductor body 32, and the memory film 33 in order from the inside.

The core 31 extends in the Z direction in a columnar shape. The core 31 contains, for example, silicon oxide. The core 31 is inside the semiconductor body 32.

The semiconductor body 32 extends in the Z direction. At least one semiconductor body 32 is included in each columnar body 30. The semiconductor body 32 has a bottomed cylindrical shape, for example. The semiconductor body 32 covers the outer surface of the core 31. The semiconductor body 32 contains, for example, silicon. The silicon is, for example, polysilicon obtained by crystallizing amorphous silicon. The semiconductor body 32 is a channel of each of the first selection transistors S1, the memory cell transistors MT, and the second selection transistors S2. The channel is a path for carriers between a source side and a drain side.

The memory film 33 extends, for example, in the Z direction. The memory film 33 covers the outer surface of the semiconductor body 32. The memory film 33 is disposed between the inner surface of the memory hole MH and the outer surface of the semiconductor body 32. The memory film 33 includes, for example, a tunnel insulating film 34, a charge storage film 35, and a cover insulating film 36. The tunnel insulating film 34, the charge storage film 35, and the cover insulating film 36 are disposed in this order close to the semiconductor body 32.

The tunnel insulating film 34 is positioned between the charge storage film 35 and the semiconductor body 32. The tunnel insulating film 34 contains, for example, silicon oxide, or silicon oxide and silicon nitride. The tunnel insulating film 34 is a potential barrier between the semiconductor body 32 and the charge storage film 35.

The charge storage film 35 is positioned between each of the conductive layers 21 and insulating layers 22, and the tunnel insulating film 34. The charge storage film 35 may be a film continuous along the columnar body 30 or a plurality of films scattered along the columnar body in the Z direction. The charge storage film 35 contains, for example, silicon nitride. The part at which the charge storage film 35 and each of the plurality of conductive layers 21 intersect functions as a transistor. The memory cell transistors MT hold data according to the presence of electric charge or an amount of electric charge accumulated in the part at which the charge storage film 35 intersects each of the plurality of conductive layers 21 (a charge storage part). Each charge storage part is disposed between a conductive layer 21 and the semiconductor body 32 and is surrounded by an insulating material.

The cover insulating film 36 is positioned between, for example, each insulating layer 22 and the charge storage film 35. The cover insulating film 36 contains, for example, silicon oxide. The cover insulating film 36 protects the charge storage film 35 from etching during processing. The cover insulating film 36 may be omitted, or a part thereof may be left between the conductive layer 21 and the charge storage film 35 to be used as a block insulating film.

In addition, a block insulating film 21a and a barrier film 21b may be disposed between each conductive layer 21 and insulating layer 22 and between each conductive layer 21 and the memory film 33 as illustrated in FIGS. 5 and 6. The block insulating films 21a curb back tunneling. Back tunneling is a phenomenon in which charges return from the conductive layers 21 to the memory film 33. The barrier film 21b enhances adhesion between the conductive layers 21 and the block insulating films 21a. The block insulating film 21a is, for example, a silicon oxide film, a metal oxide film, and a stack structure film in which a plurality of insulating films are stacked. An example of the metal oxide is aluminum oxide. For example, when the conductive layers 21 are made of tungsten, the barrier film 21b may be titanium nitride or a stacked structure film of titanium nitride and titanium.

The interlayer insulating layers 40 and 41 are disposed on the insulating layer 22 that is the top layer of the stacked body 20. The interlayer insulating layers 40 and 41 insulate the stacked body 20 from the bit lines BL. The interlayer insulating layers 40 and 41 contain, for example, silicon oxide.

The first contacts C1 and the second contacts C2 are contact plugs electrically connecting the columnar bodies 30 and the bit lines BL. The first contacts C1 and the second contacts C2 are inside the interlayer insulating layer 40. The first contacts C1 and the second contacts C2 penetrate the interlayer insulating layer 40 in the Z direction. The second contacts C2 project from the first surface 20a of the stacked body 20 to the inside of the stacked body 20. Each second contact C2 has, for example, a portion disposed between two columnar bodies 30 that are connected to the second contact C2. Specifically, the second contact C2 includes the portion disposed between the respective semiconductor bodies 32 of the two columnar bodies 30 that are connected to the second contact C2. The first contacts C1 and the second contacts C2 are conductive bodies filling openings formed in the interlayer insulating layer 40. The first contacts C1 and the second contacts C2 are made of, for example, tungsten.

Each first contact C1 is connected to the semiconductor body 32 of one columnar body 30. Each second contact C2 is connected to the respective semiconductor bodies 32 of a plurality of columnar bodies 30. Each second contact C2 is connected to, for example, the respective semiconductor bodies 32 of two columnar bodies 30.

The first contacts C1 and the second contacts C2 have different shapes in a plan view taken in the Z direction. The first contacts C1 are, for example, substantially circular, and the second contacts C2 are, for example, elliptical, oval or rectangular in a plan view taken in the Z direction. A perimeter of each first contact C1 is, for example, shorter than a perimeter of each second contact C2. The second contacts C2 each have, for example, anisotropy in a plan view taken in the Z direction and have a long axis and a short axis. The width of the second contact C2 in the Y direction is, for example, longer than the width of the first contact C1 in the Y direction. In addition, the width of the second contact C2 in the long axis direction is, for example, longer than the width of the first contact C1 in the long axis direction. The long axis of each second contact C2 is inclined with respect to, for example, the Y direction. The line A-A of FIG. 3 is aligned with the long axis directions of the second contacts C2. Within the same finger F, for example, inclination directions of the long axes of the second contact C2 with respect to the Y direction may be the same, and inclination angles of the long axes of the second contacts C2 with respect to the Y direction may be equal.

Each second contact C2, for example, spans a plurality of columnar bodies 30 sandwiching second slits SHE therebetween. Each second slit SHE is disposed between two semiconductor bodies 32 that are connected to the same second contact C2. The two semiconductor bodies 32 that are connected to the same second contact C2 are, for example, in contact with the second slit SHE. The second contact C2 is, for example, in contact with the two columnar bodies 30 sandwiching the second slit SHE therebetween. The second contact C2 is, for example, connected to the respective semiconductor bodies 32 of the two columnar bodies 30 sandwiching the second slit SHE therebetween. In the first string STRa and the second string STRb, the columnar bodies 30 that are adjacent to the second slits SHE in the Y direction are connected to the second contacts C2, and the other columnar bodies 30 are connected to the first contacts C1. The number of first contacts C1 in the first string STRa is, for example, larger than the number of first contacts C1 in the second string STRb. That is, the number of first contacts C1 connected to the semiconductor bodies 32 that are disposed between adjacent first slit ST and second slit SHE is greater than the number of first contacts C1 connected to the semiconductor bodies 32 that are disposed between two adjacent second slits SHE.

Vias V1 are inside the interlayer insulating layer 41. The vias V1 penetrate the interlayer insulating layer 41 in the Z direction. The vias V1 are conductors filling openings formed in the interlayer insulating layer 41. The vias V1 are formed of, for example, tungsten.

The vias V1 electrically connect the first contacts C1 or the second contacts C2 to the bit lines BL. The vias V1 electrically connect one first contact C1 or one second contact C2 to one bit line BL. One via V1 is connected to each of the first contacts C1 and the second contacts C2.

The vias V1 are smaller than the first contacts C1 and the second contacts C2 and are included in the first contacts C1 or the second contacts C2 in a plan view taken in the Z direction. The geometric center of each via V1, for example, deviates from the geometric center of each first contact C1 or the geometric center of each second contact C2.

The vias V1 connected to the second contacts C2 are connected to a first region A1 or a second region A2 of each second contact C2. The first region A1 is one of the regions sandwiching the center line passing through the geometric center of the second contact C2 and extending in the short axis direction, and the second region A2 is the other region. Among two second contacts C2 that are adjacent in the Y direction, for example, one second contact C2 has the via V1 disposed in the first region A1, and the other second contact C2 has the via V1 disposed in the second region A2.

A plurality of bit lines BL are on the interlayer insulating layer 41. Each of the bit lines BL extends in the Y direction. The bit lines BL are electrically connected to the columnar bodies 30 via the first contacts C1 or the second contacts C2 and the vias V1. Each of the bit lines IL is electrically connected to one columnar body 30 in a string STR.

Here, the columnar bodies 30 arranged in the Y direction in the zigzag in each string STR are called a first columnar body 30A, a second columnar body 30B, a third columnar body 30C, and a fourth columnar body 30D, respectively. In each string STR, the first columnar body 30A, the second columnar body 30B, the third columnar body 30C, and the fourth columnar body 30D are arranged in this order in the Y direction. In addition, the bit lines BL that are electrically connected to any of the first columnar body 30A, the second columnar body 30B, the third columnar body 30C, and the fourth columnar body 30D are called a first bit line BL1, a second bit line BL2, a third bit line BL3, and a fourth bit line BL4, respectively. The first bit line BL1, the second bit line BL2, the third bit line BL3, and the fourth bit line BL4 are arranged in this order in the −X direction.

In a certain string STR (e.g., the first string STRa), the first columnar body 30A is electrically connected to the first bit line BL1, the second columnar body 30B is electrically connected to the third bit line BL3, the third columnar body 30C is electrically connected to the second bit line BL2, and the fourth columnar body 30D is electrically connected to the fourth bit line BL4.

Meanwhile, in a string (e.g., the second string STRb) that is adjacent to the aforementioned string STR (e.g., the first string STRa), the first columnar body 30A is electrically connected to the fourth bit line BL4, the second columnar body 30B is electrically connected to the third bit line BL3, the third columnar body 30C is electrically connected to the second bit line BL2, and the fourth columnar body 30D is electrically connected to the first bit line BL1.

That is, the bit lines BL connected to the first columnar body 30A and the fourth columnar body 30D differ in adjacent strings STR. The reason for this is that the second contacts C2 are connected spanning two columnar bodies 30 sandwiching the second slit SHE therebetween.

Next, a method for manufacturing a portion of the cell array region of the semiconductor memory 1 according to the first embodiment will be described. FIGS. 7 to 12 introduced below are cross-sectional views for describing an example of a method for manufacturing the cell array region.

Figure 7:
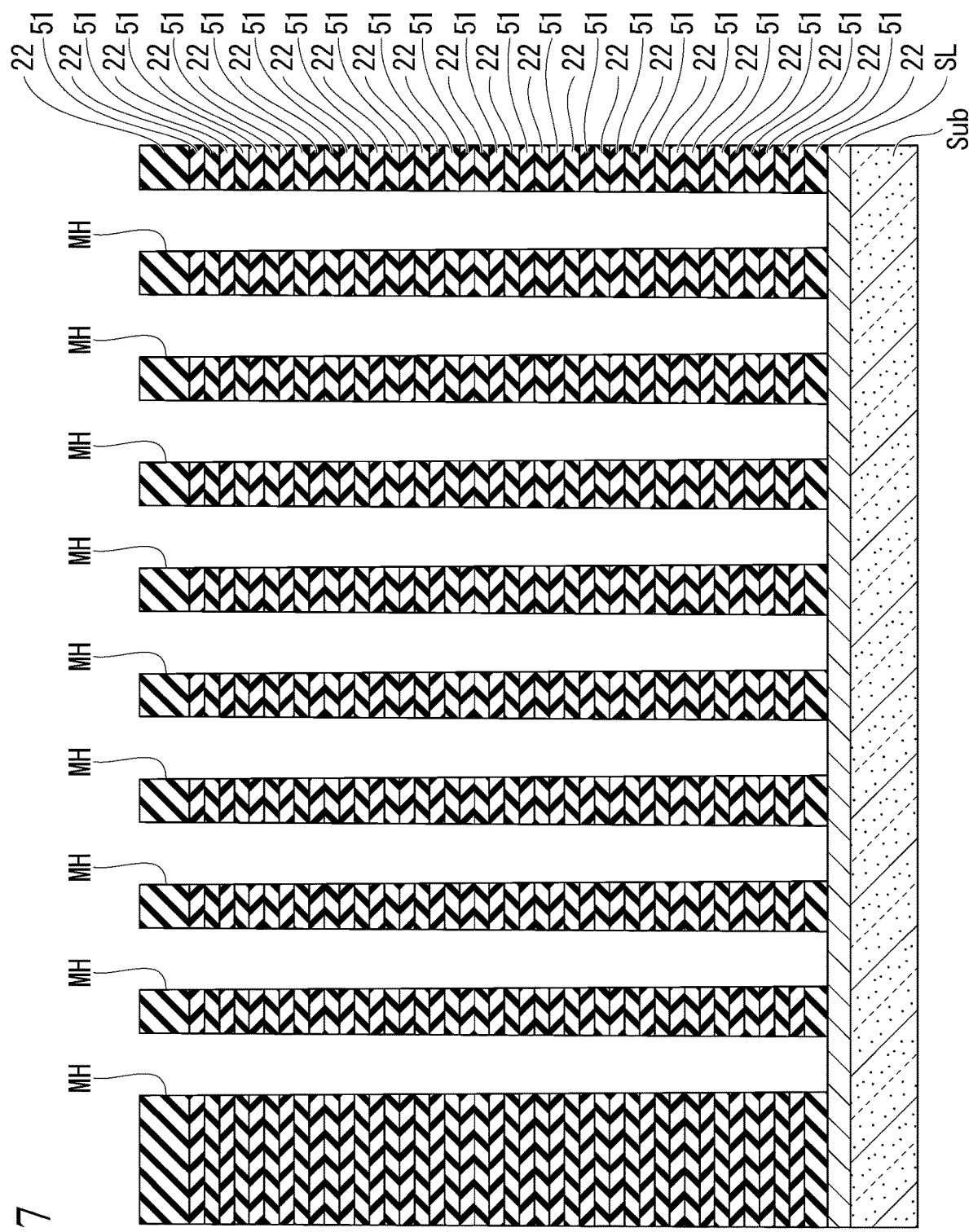
FIG. 7 is a cross-sectional view for describing an example of a manufacturing method of a cell array region of the semiconductor storage device according to the first embodiment.

First, the source line SL is stacked on the substrate Sub as illustrated in FIG. 7. Next, the insulating layers 22 and sacrificial films 51 are alternately stacked on the source line SL. The insulating layers 22 are as described above containing, for example, silicon oxide. The sacrificial films 51 contain, for example, silicon nitride. Next, the memory holes MH are formed in the stacked body. The memory holes MH extend from the top surface of the stacked body to the source line SL. The memory holes MH are formed by etching. For example, the portion from the top surface of the stacked body to the source line SL is subjected to anisotropic etching. This anisotropic etching may be, for example, reactive ion etching (RIE).

Figure 8:
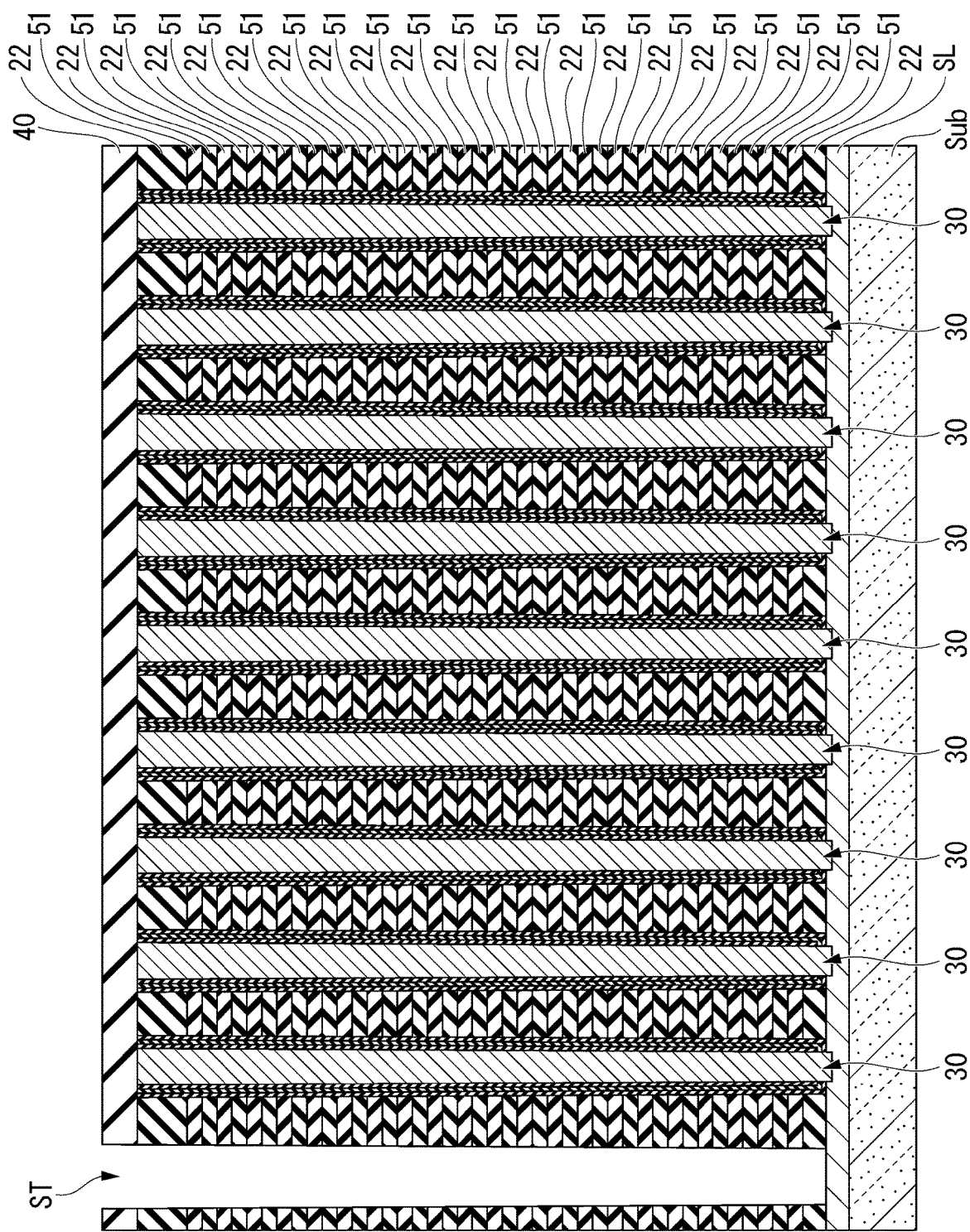
FIG. 8 is a cross-sectional view for describing an example of the manufacturing method of a cell array region of the semiconductor storage device according to the first embodiment.

Next, the memory film 33, the semiconductor body 32, and the core 31 are formed in each memory hole MH in order as illustrated in FIG. 8. Each memory hole MH is filled with the memory film 33, the semiconductor body 32, and the core 31. The columnar bodies 30 are formed inside the memory hole MH. Next, after the interlayer insulating layer 40 is stacked on the stacked body, the first slit ST is formed. The first slit ST extends from the top surface of the stacked body to the source line SL. The first slit ST is formed from anisotropic etching.

Figure 9:
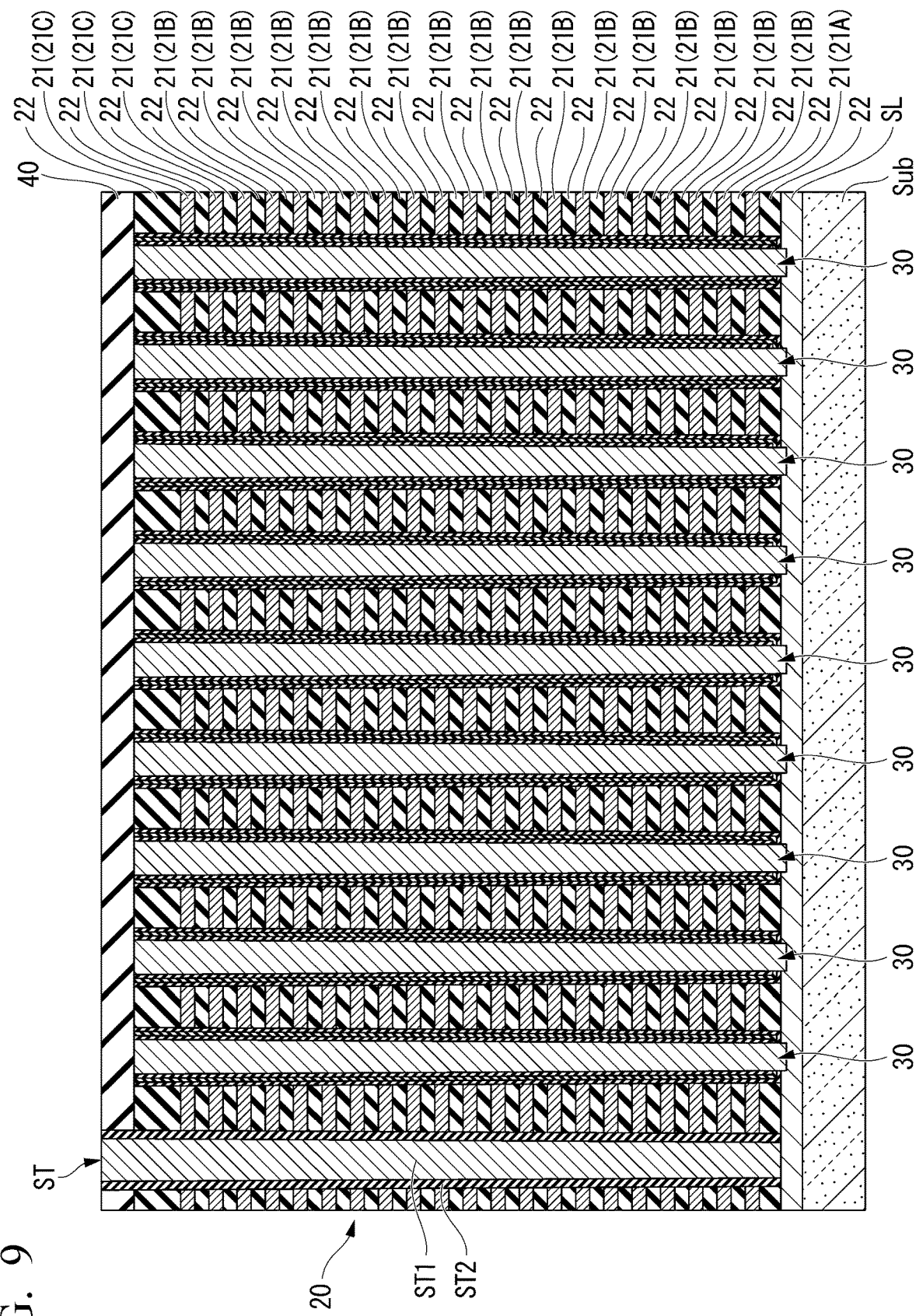
FIG. 9 is a cross-sectional view for describing an example of the manufacturing method of a cell array region of the semiconductor storage device according to the first embodiment.

Next, the sacrificial films 51 undergo isotropic etching through the first slit ST. The sacrificial films 51 are removed by the isotropic etching. The isotropic etching is performed using an etchant that can etch the sacrificial films 51 more quickly than the insulating layers 22. The isotropic etching is performed using an etchant that can etch, for example, silicon nitride more quickly than silicon oxide. The portion in which the sacrificial films 51 are removed is filled with a conductive material, thereby forming the conductive layers 21. Then, the coating layer ST2 and the conductor ST1 are deposited in order inside the first slit ST as illustrated in FIG. 9.

Figure 10:
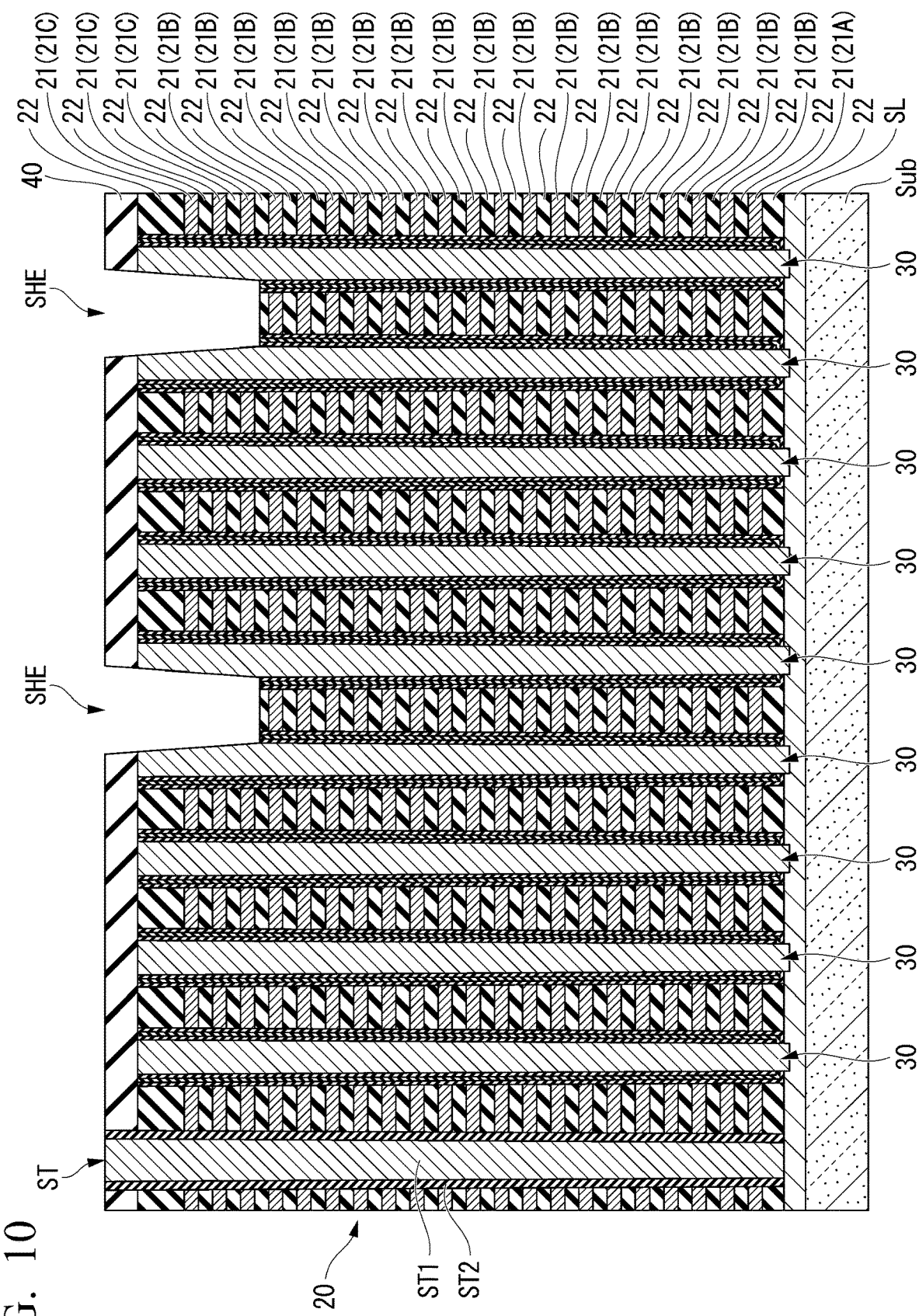
FIG. 10 is a cross-sectional view for describing an example of the manufacturing method of a cell array region of the semiconductor storage device according to the first embodiment.

Next, the second slits SHE are formed inside the stacked body 20 as illustrated in FIG. 10. The second slits SHE extend from the top surface of the stacked body 20 to a halfway point of the stacked body 20. The second slits SHE are formed through anisotropic etching.

Figure 11:
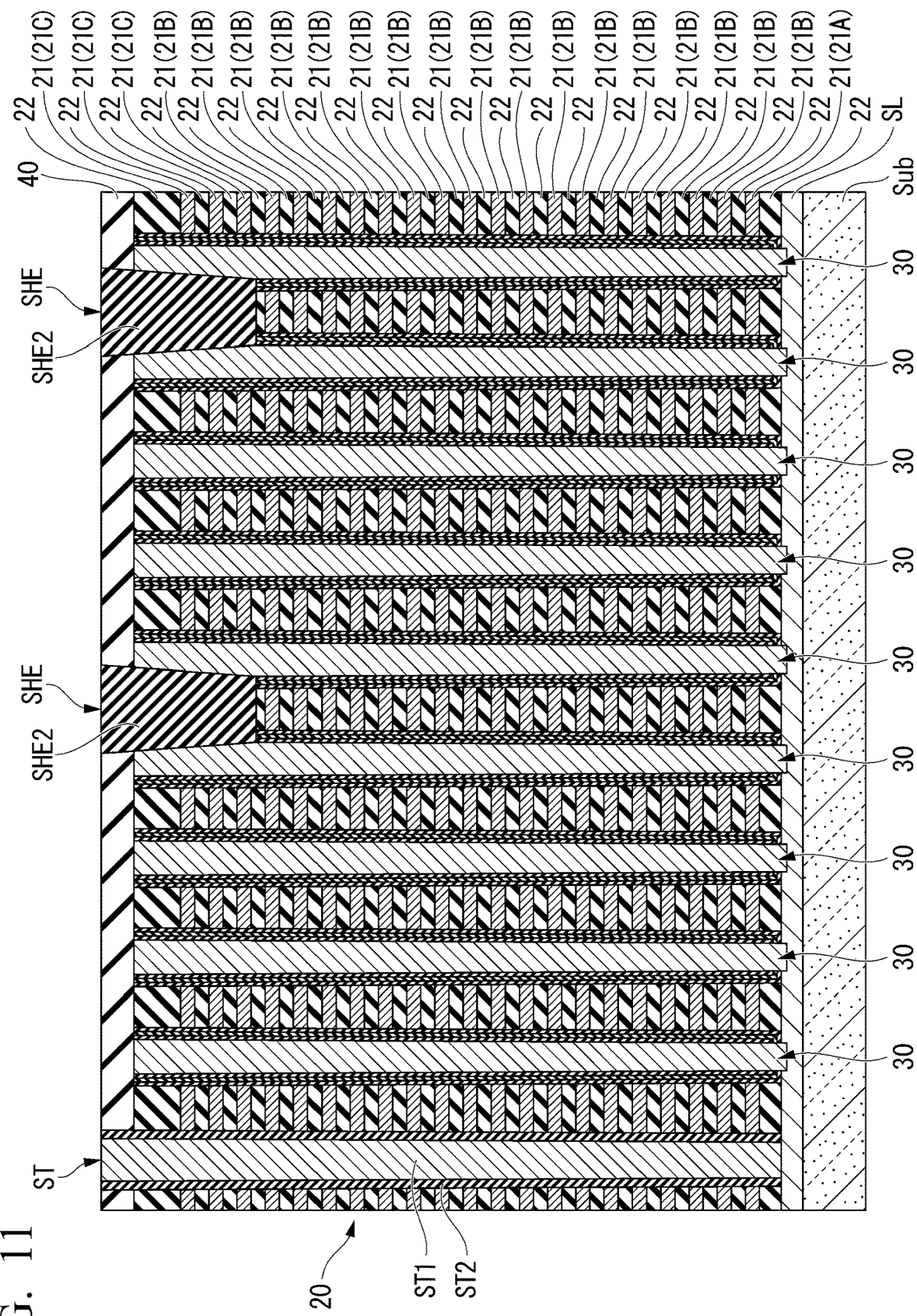
FIG. 11 is a cross-sectional view for describing an example of the manufacturing method of a cell array region of the semiconductor storage device according to the first embodiment.

Next, the second slits SHE are filled with insulators SHE2 as illustrated in FIG. 11. The insulators SHE2 contain, for example, silicon oxide.

Figure 12:
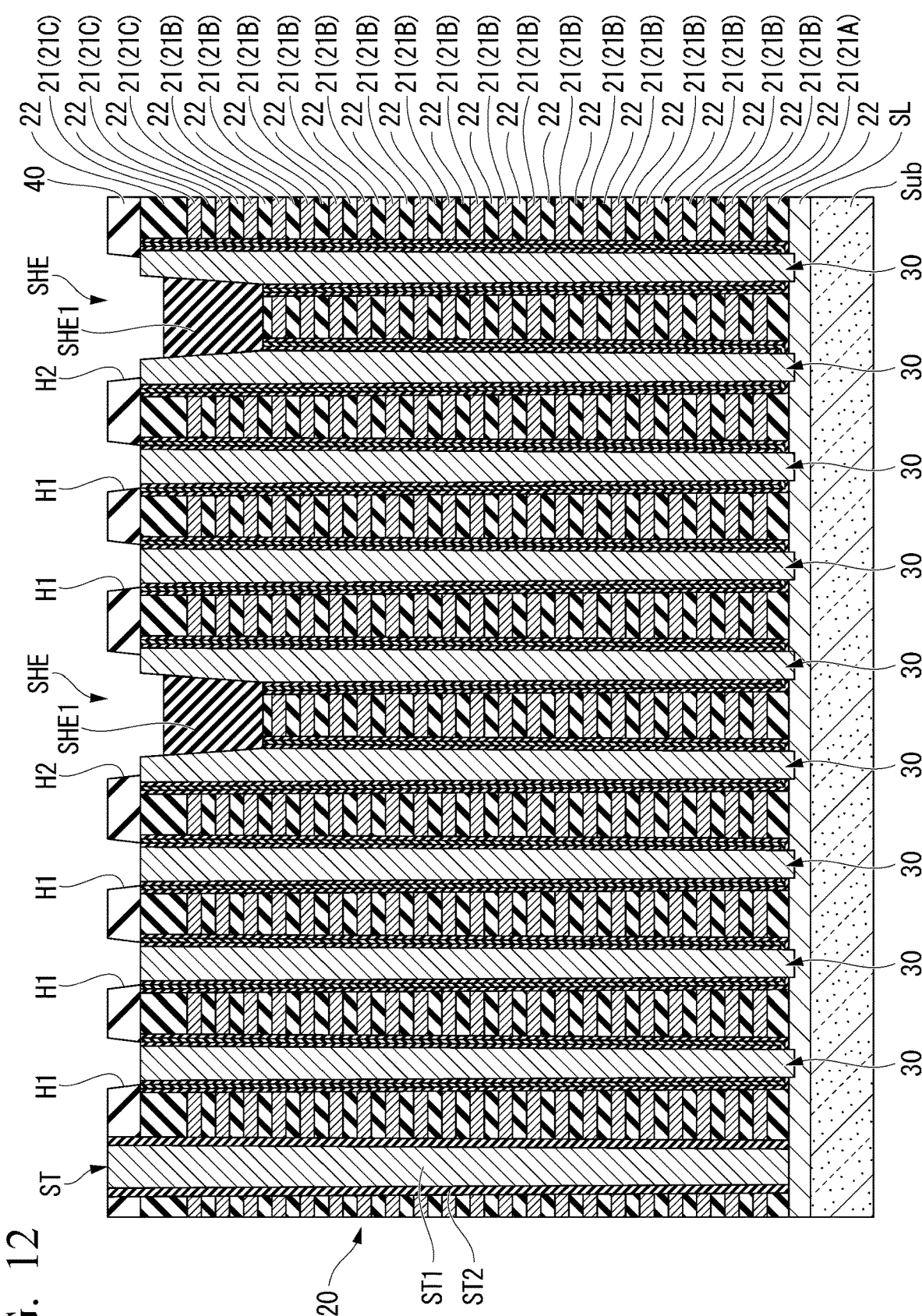
FIG. 12 is a cross-sectional view for describing an example of the manufacturing method of a cell array region of the semiconductor storage device according to the first embodiment.

Next, holes H1 and H2 are formed in the interlayer insulating layer 40 as illustrated in FIG. 12. The holes H1 penetrate the interlayer insulating layer 40 and reach the columnar bodies 30. The holes H2 penetrate the interlayer insulating layer 40 and reach a halfway point of the stacked body 20. Parts of the insulators SHE2 are removed through anisotropic etching, thereby forming the insulators SHE1.

Next, the holes H1 and H2 are filled with a conductive material, thereby forming the first contacts C1 and the second contacts C2. The interlayer insulating layer 41 is stacked on the interlayer insulating layer 40, the first contacts C1, and the second contacts C2. Openings are formed in the interlayer insulating layer 41, and the openings are filled with a conductive material, thereby forming the vias V1. Finally, the bit lines BL are formed at the positions overlapping the vias V1.

After going through the above-described steps, the cell array region illustrated in FIG. 4 is manufactured. The manufacturing steps introduced here are merely an example, and other steps may be inserted between each step.

According to the semiconductor memory 1 according to the first embodiment, the integration characteristics of the memory cell transistors MT can be improved. The semiconductor memory 1 according to the first embodiment can cause any of the columnar bodies 30 to function as a storage region, instead of a dummy. That is, since the columnar bodies 30 functioning as storage regions are densely arranged, the semiconductor memory 1 according to the first embodiment has excellent integration characteristics. In addition, since the second contacts C2 are connected to two columnar bodies 30 of different strings STR, the number of vias V1 is reduced. In a case where one contact is formed for each of the columnar bodies 30, the vias V1 are likely to be closer in the two columnar bodies 30 sandwiching the second slit SHE therebetween. By reducing the number of vias V1 at the part in which the vias V1 are likely to be close, the risk of the vias V1 short-circuiting due to a manufacturing error can be reduced.

First Modified Example

Next, a first modified example of the embodiment will be described.

Figure 13:
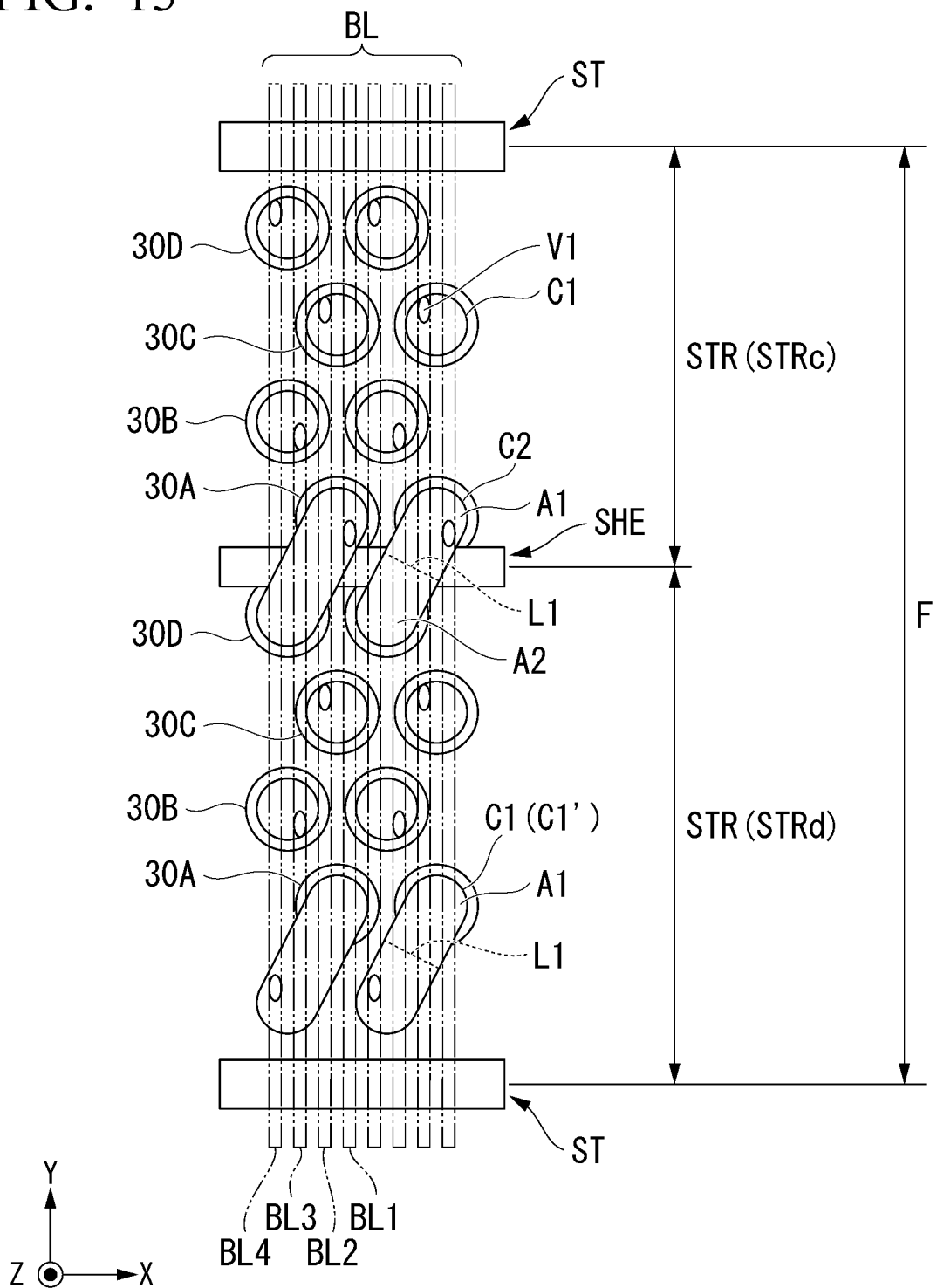
FIG. 13 is a plan view of a cell array region according to a first modified example.

FIG. 13 is a plan view of a characteristic part of a cell array region according to the first modified example of the first embodiment. The cell array region according to the first modified example differs from that of the structure illustrated in FIG. 3 in that the number of strings STR in one finger F is an even number. Configurations other than those described below are similar to those of the memory cell array 10 of the first embodiment.

The finger F according to the first modified example has an even number of strings STR. The finger F illustrated in FIG. 13 includes two strings STR. There are an odd number of second slits SHE, for example, between adjacent first slits ST. When the number of strings STR is even, a width of any string STR in the Y direction is different from a width of another string STR in the Y direction. In the example illustrated in FIG. 13, a width of one string STR (which will be referred to as a third string STRc below) in the Y direction is shorter than a width of the other string STR (which will be referred to as a fourth string STRd below) in the Y direction.

As described above, each of the bit lines BL is electrically connected to different columnar bodies 30 in the strings STR. In the third string STRc, a first columnar body 30A is electrically connected to a first bit line BL1, a second columnar body 30B is electrically connected to a third bit line BL3, a third columnar body 30C is electrically connected to a second bit line BL2, and a fourth columnar body 30D is electrically connected to a fourth bit line BL4.

A second contact C2 is connected spanning the fourth columnar body 30D of the fourth string STRd and a first columnar body of the third string STRc. Thus, the fourth columnar body 30D of the fourth string STRd is electrically connected to the first bit line BL1. The columnar bodies 30 within the same string STR are connected to different bit lines BL. For this reason, in the fourth string STRd, the fourth columnar body 30D is electrically connected to the first bit line BL1, the third columnar body 30C is electrically connected to the second bit line BL2, the second columnar body 30B is electrically connected to the third bit line BL3, and the first columnar body 30A is electrically connected to the fourth bit line BL4.

The fourth bit line BL4 is not provided immediately above the first columnar body 30A. In order to electrically connect the first columnar body 30A to the fourth bit line BL4, a first contact C1 connected to the first columnar body 30A of the fourth string STRd extends in the X direction and the Y direction. Among first contacts C1, a contact having a shape in a plan view taken in the Z direction different from that of the other first contacts C1 will be referred to as a first contact C1'. The first contact C1' overlaps the first columnar body 30A and vias V1 in the Z direction. In order to prevent the first contact C1' from short-circuiting with a conductor ST1 within a first slit ST, the first contact C1' is separated by a certain distance or farther from the first slit ST. As a result, a width of the third string STRc in the Y direction is different from a width of the fourth string STRd in the Y direction.

Although it is necessary to ensure a space for forming the first contact C1', the integration characteristics of the memory cell transistors MT are improved in the above configuration as well as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing form the spirit of the inventions. The accompanying claims and their equivalents are intended to cover such forms or modifications as would fall within the scope and sprit of the inventions.

What is claimed is:

1. A semiconductor storage device comprising:
a stacked body in which a conductive layer and an insulating layer are stacked alternately in a first direction;
a plurality of columnar bodies that extend in the first direction inside the stacked body and each includes an insulating core and a semiconductor body surrounding the insulating core:
a plurality of charge storage films that are disposed between at least one of a plurality of the conductive layers and each of a plurality of the semiconductor bodies;
a plurality of bit lines that extend above the stacked body in a second direction intersecting the first direction;
an interlayer insulating layer that is between the stacked body and the plurality of bit lines; and
a plurality of contacts each of which penetrates the interlayer insulating layer and is electrically connected to corresponding one of the plurality of bit lines,
wherein the plurality of contacts include at least one of first contacts that is connected to corresponding one of the plurality of semiconductor bodies and at least one of second contacts that is connected to corresponding two of the plurality of semiconductor bodies, wherein
the stacked body further includes at least one of first dividers that respectively separates some of the plurality of conductive layers in the second direction and extends in a third direction intersecting the first direction and the second direction, and
when a specific second contact among the second contacts is disposed directly above a specific first divider among the first dividers, the specific first divider is disposed between corresponding two columnar bodies among the plurality of columnar bodies, and the specific second contact is directly connected to respective two insulating cores in the corresponding two columnar bodies.

2. The semiconductor storage device according to claim 1, wherein, in a plan view taken in the first direction, a width of the one of the second contacts in the second direction is greater than a width of the one of the first contacts in the second direction.

3. The semiconductor storage device according to claim 1, wherein the one of the second contacts has a long axis and a short axis in a plan view taken in the first direction, and
wherein, in a plan view taken in the first direction, a width of the one of the second contacts in a long axis direction is greater than a width of the one of the first contacts in the long axis direction.

4. The semiconductor storage device according to claim 1, wherein each of the second contacts has a long axis and a short axis in a plan view taken in the first direction, and
wherein long axis directions of the respective second contacts are inclined at an equal inclination angle with respect to the second direction.

5. The semiconductor storage device according to claim 1, wherein the specific first divider is disposed between corresponding two semiconductor bodies connected to a same one of the second contacts.

6. The semiconductor storage device according to claim 5, wherein each of the two semiconductor bodies connected to the same one of the second contacts is in contact with the specific first divider.

7. The semiconductor storage device according to claim 5, further comprising:
   a plurality of second dividers that extend in the third direction and separate all of the plurality of conductive layers in the second direction,
   wherein an even number of the first dividers are disposed between adjacent second dividers among the plurality of second dividers.

8. The semiconductor storage device according to claim 7, wherein the number of first contacts connected to the semiconductor bodies that are disposed between adjacent first divider and second divider is greater than the number of first contacts connected to the semiconductor bodies that are disposed between two adjacent first dividers.

9. The semiconductor storage device according to claim 1,
   wherein the plurality of contacts include a third contact that is connected to a first semiconductor body among the plurality of semiconductor bodies and a second contact that is connected to a second semiconductor body and a third semiconductor body among the plurality of semiconductor bodies,
   wherein the least one of the second contacts is connected to one of the plurality of bit lines via a via,
   wherein the least one of the second contacts has a long axis and a short axis in a plan view taken in the first direction,
   wherein the least one of the second contacts, has a first region and a second region partitioned by a center line passing through a geometric center of the least one of the second contacts and extending in a short axis direction, and
   wherein, in two second contacts adjacent in the second direction, one of the second contacts has the via disposed in the first region and the other one of the second contacts has the via disposed in the second region.

10. The semiconductor storage device according to claim 1, wherein the second contacts each have a portion disposed between two adjacent semiconductor bodies connected to the second contacts.

\* \* \* \* \*